United States Patent [19]

Mullen, III et al.

[11] Patent Number: 4,626,309

[45] Date of Patent: Dec. 2, 1986

[54] SELECTIVE BONDING INTERCONNECTION MASK

[75] Inventors: William B. Mullen, III, Boca Raton, Fla.; James H. Grotelueschen, Westchester; Robert Henschel, Chicago, both of Ill.

[73] Assignee: Motorola, Inc., Schaumburg, Ill.

[21] Appl. No.: 627,127

[22] Filed: Jul. 2, 1984

[51] Int. Cl.$^4$ ................... B32B 31/04; B32B 31/12
[52] U.S. Cl. .................... 156/289; 156/292; 156/290; 29/830; 428/138; 428/133
[58] Field of Search ............... 156/289, 292, 182, 295, 156/252, 290, 309.6, 629; 29/827, 830; 174/68.5; 361/411, 402; 428/140, 212, 901, 138, 133

[56] References Cited

U.S. PATENT DOCUMENTS

| | | | |
|---|---|---|---|
| 3,411,205 | 11/1968 | McGinley | 156/629 X |
| 3,789,470 | 2/1974 | Owaki et al. | 29/25.13 |
| 3,972,755 | 8/1976 | Misfeldt | 156/630 |
| 4,037,047 | 7/1977 | Taylor | 174/68.5 |
| 4,088,805 | 5/1978 | Wiegand | 428/310 |
| 4,339,303 | 7/1982 | Frisch et al. | 156/629 |
| 4,404,059 | 9/1983 | Livshits et al. | 156/629 |
| 4,421,811 | 12/1983 | Rose et al. | 428/116 |
| 4,446,188 | 5/1984 | Patel et al. | 428/901 X |
| 4,457,796 | 7/1984 | Needham | 156/295 X |
| 4,496,793 | 1/1985 | Hanson et al. | 174/68.5 |

OTHER PUBLICATIONS

Electronics, "Epoxy Called Better Than Conventional Solder for Surface-Mounting Components on Board", May 31, 1984, p. 46.

Primary Examiner—Edward Kimlin
Assistant Examiner—Ramon R. Hoch
Attorney, Agent, or Firm—Daniel K. Nichols; Joseph T. Downey; Mark P. Kahler

[57] ABSTRACT

An interconnection mask which is sandwiched between two members to be bonded together is comprised of a thin sheet of preselected material which has a plurality of apertures therein which are positioned, sized, and shaped to define the common bonding areas between the two members whereby structural failures induced by bonding and loading characteristics of the two members are minimized. A method for making an apparatus which utilizes the interconnection mask comprises the steps of preparing a mask of preselected material having a plurality of apertures therein, each aperture being positioned, sized and shaped to define a common bonding area between first and second members of the apparatus whereby the structural failures induced by the bonding and loading characteristics of the two members are minimized; placing a layer of bonding material on a surface of the first member; placing the interconnection mask over the layer of bonding material; placing the second member over the mask; bonding the first and second members together at each common bonding area defined by the apertures in the mask.

7 Claims, 3 Drawing Figures

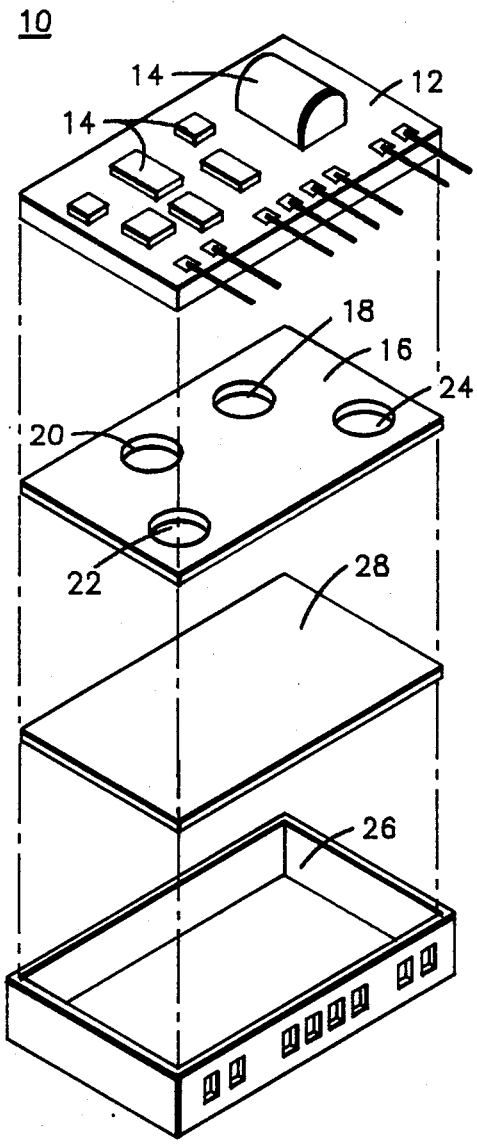
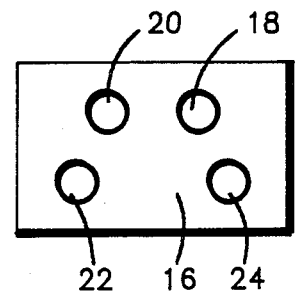
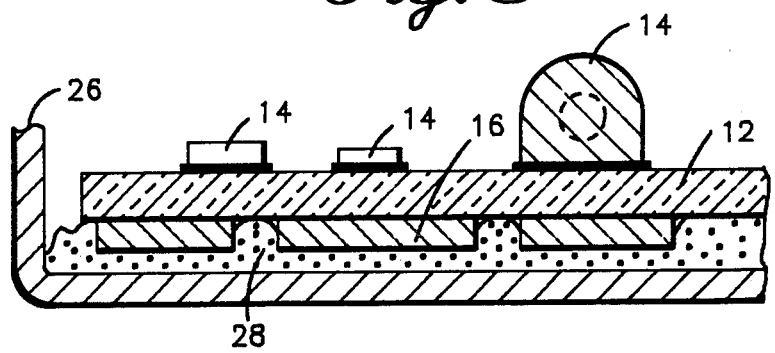
Fig. 1
Fig. 2
Fig. 3

SELECTIVE BONDING INTERCONNECTION MASK

BACKGROUND OF THE INVENTION

1. Field of the Invention

The present invention relates to bonding techniques and more particularly to a selective bonding interconnection mask sandwiched between two members which are to be bonded together in order to minimize the structural failures induced by the bonding and loading characterists of the two members and the method of making such an apparatus.

2. Description of the Prior Art

With the present bonding techniques for bonding materials with different thermal coefficients of expansion and specific adhesion properties, strain related failures caused by thermal expansion mismatches and different adhesive properties between the different materials have been detected during temperature cycling.

For example, when two members are bonded together along their continuous interface, the weaker member will tend to experience a structural failure under a variety of loading conditions which includes thermal loading. This happens, in part, because the weaker member is not able to freely deform in those regions where it is most severely strained. By bonding the two members together at localized regions of traditionally low strain, this situation can be avoided. That is, regions of traditionally high strain are not bonded and are therefore free to deform in such a way as to reduce the strain in these critical areas. High strain regions commonly exist in the corners and at the mid-span locations along the edges of rectangular members. Hence, bonding between members should not occur at these corner or mid-span locations.

Presently, there are various techniques used in the bonding of two disimilar materials together in order to overcome the aforesaid problem. One such technique is selective bonding in which the selected bonding agent or adhesive is applied to preselected areas of one of the members to be bonded. However, this technique normally requires special equipment and additional processes to be implemented and thus proves to be quite expensive. Alternatively, the selective application may be done manually but quality problems inherent in large area bonding due to inconsistent control of the process result. Further, the application of the bonding agent or adhesive to specific areas of members, having dissimilar adhesive properties, to be bonded together may compromise the quality of the bond and result in mechanical failure, due to shock or severe temperatures. The reduction in bonding quality may be primarily attributable to the condition of having equally sized bonding areas on the opposed surfaces of the members with one of the surfaces demonstrating a lower specific adhesion ability than the other surfaces demonstrating a lower specific adhesion ability than the other surface with respect to the selected adhesive.

Another technique to minimize structural related failures is to select thermally matched materials to be bonded together, that is those which demonstrate the same coefficient of thermal expansion and adhesive characteristics. However, such a solution introduces various processing compatibility problems, such as weldability, solderability, plateability, environmental stability, and most importantly an increase in cost.

Another technique uses a flexible adhesive in order to reduce structural failures, but sacrifices both conductivity, if necessary and mechanical age stability.

SUMMARY OF THE INVENTION

Accordingly, one object of the present invention is to provide a novel interconnection mask sandwiched between two members to be bonded together which includes means to define the common areas where bonding may occur in order to minimize structural failures.

It is yet another object of the present invention to provide a novel interconnection mask sandwiched between two members to be bonded together which has at least one aperture, the least one aperture being positioned, sized and shaped to define at least one common bonding area between the two members whereby structural failures induced by the bonding and loading characteristics of the two members are minimized.

It is still another object of the present invention to provide a method of bonding first and second members together in such a manner as to minimize structural failures induced by the bonding and loading characteristics of the first and second members.

It is yet still another object of the present invention to provide a multiple layered apparatus having a mask sandwiched between two of the layers to be bonded together which minimizes the structural failures induced by the bonding and loading characteristics of the two layers.

Another object of the present invention is to provide a novel method of bonding two members together which provides consistent, reliable results in minimizing related structural failures at a low cost.

Still another object of the present invention is to provide a novel method and apparatus which enables the bonding areas on the opposed surface of a first member to be selected in different locations from the bonding areas on the opposed surface of a second member to be bonded to the first member.

The above and other objects and advantages of the present invention are provided by an inter connection mask which is sandwiched between the two members to be bonded together, in the preferred embodiment the interconnection mask comprising a thin sheet of preselected material having a plurality of apertures therein the apertures positioned, sized and shaped to define the common bonding areas between the two members whereby the structural failures induced by the bonding and loading characteristics of the two members are minimized. The method described in the preferred embodiment for bonding first and second apparatus together to minimize structural failures includes the steps of: preparing a mask of preselected material having a plurality of apertures therein, the apertures being positioned, sized and shaped to define the common bonding areas between the first and second members whereby the structural failures induced by the bonding and loading characteristics of the first and second members are minimized; placing a layer of bonding material on a surface of the first member; placing the mask over the layer of bonding material; placing the second member over the mask; and compressing the first and second members together while heating thhe apparatus whereby bonding of the first member to the second member occurs.

BRIEF DESCRIPTION OF THE DRAWINGS

A more complete appreciation of the invention and many of the attendant advantages thereof will be readily obtained as the same becomes better understood by reference to the following detailed description to be considered in connection with the accompanying drawings wherein:

FIG. 1 is an exploded perspective view of an apparatus employing the present invention;

FIG. 2 is a top view of the interconnect mask according to the present invention;

FIG. 3 is a cross-sectional view of the assembled apparatus of FIG. 1.

DESCRIPTION OF THE PREFERRED EMBODIMENTS

Referring now to the drawings, wherein like reference numerals designate identical or corresponding parts throughout the several views, and more particularly to FIG. 1 thereof, an apparatus employing the present invention is illustrated. The apparatus 10 includes a ceramic substrate 12 having a plurality of electronic components 14 mounted thereon, the ceramic substrate being constructed of a 96 percent alumina; an interconnection mask 16 having a plurality of apertures 18, 20, 22, and 24 constructed of a polytetrafluoroethylene film, or insulating material, manufactured under the trademark Teflon TM by DuPont; a conductive epoxy preform 28; and a metal housing 26 constructed of copper, nickel and zinc for receiving the mask 16 and the ceramic substrate 12. The metal housing 26 is sized and shaped to provide alignment for the substrate 12, mask 16 and epoxy preform 28 during assembly of the apparatus 10.

Referring now to FIG. 2 a top view of the teflon interconnect mask 16 is illustrated. In the preferred embodiment the Teflon TM mask 16 is 1.425 inches long, 0.783 inches wide and has a thickness of 0.992 inches. The center of the aperture 18 is 0.480 inches from the right edge of the mask and 0.265 inches from the top edge of the mask 16. The center of aperture 20 is 0.945 inches from the right edge of the mask 16 and 0.265 inches from the top edge of the mask 16. The center of aperture 22 is 1.160 inches from the right edge of the mask 16 and 0.593 inches from the top edge of the mask 16. The aperture 24 has its center 0.593 inches from the top edge of the mask 16 and 0.265 inches from the right edge of the mask 16. The diameter of each of the apertures is 0.25 inches. It should be noted that classical stress analysis theory suggests high strain concentration areas (i.e. areas where structural failures may initiate) to be primarily in the corners of the substrate 12 and at the four mid-span locations along the edges of the substrate 12. Thus, the centers of each of the apertures 18, 20, 22 and 24, were selected to be placed as far as practicable from the high strain and deflection concentration areas and still maintain the mechanical integrity of the package 10.

Another consideration is selecting the locations of the apertures 18, 20, 22 and 24 is to, within practical limits, locate the apertures directly under the large electronic components on the substrate in substantial alignment therewith, as opposed to being located far off center. This will minimize localized bending, shear and tensile strains from being developed in the substrate. Hence, the substrate will have less of a tendency to experience localized structural failures in the vicinity of the apertures.

Another consideration in selecting the location of the apertures is the necessity of grounding sites and/or conductive paths between the substrate and housing in which case a conductive epoxy may be used to bond the substrate 12 to the metal housing 26 in order to provide the conductive paths through the apertures. In the event such an option is required particular attention must be paid to the electrical characteristics of the conductive paths, such as impedance and/or the creation of unwanted capacitance which may adversely affect the operation of the electronic components mounted on the substrate 12. The location of the apertures may also be selected to prevent the epoxy from shorting out adjacent leads on the substrate. Referring now to FIG. 3 a cross-sectional view of FIG. 1 showing the final assembled apparatus is illustrated. The method of making the apparatus 10 can be understood by referring to FIG. 3. First an electrically conductive epoxy preform is applied to the inside surface of the metal housing 26. Next, the TEFLON interconnection mask 16 is placed over the epoxy preform 28. Next, the ceramic substrate 12 is placed over the mask 16. Finally, a clamping force is applied to the metal housing 26 and ceramic substrate 12 while the apparatus 10 is heated in an oven for a period long enough to allow the epoxy in the epoxy preform to flow through the apertures 18, 20, 22 and 24 to bond the substrate 12 to the metal housing 26 and to allow the epoxy to cure. Thus, the apertures 18, 20, 22 and 24 in the Teflon interconnect mask 16 define the common locations at which the epoxy may contact the substrate 12 and metal housing 26 and further allows the bonding to occur in such a way that the possibility of structural failures are minimized. It should be further understood that in this embodiment substantially the entire inner surface of the housing 26 is adhered to the epoxy preform, while only those locations on the substrate as defined by the apertures in the mask are bonded by epoxy. It should further be noted that the mask 16 may also be made of a conductive material in order to provide additional desired grounding requirements necessary in a particular electrical environment.

In an alternate embodiment, a second mask (not shown) may be interposed between the epoxy preform 28 and the metal housing 26. The second mask would include apertures, not necessarily positioned, sized and shaped the same as the apertures in the first mask, to define the desired bonding areas on the inner surface of the metal housing 26. Thus, the ability to bond members, having dissimilar adhesive properties, together is enhanced.

Obviously, (numerous additional) modifications, and variations of the present invention are possible in light of the above teachings. It is therefor to be understood that within the scope of the appended claims, the invention may be practiced otherwise then as specifically described herein.

What is new and desired to be secured by Letters Patent of the United States is:

1. A method of bonding first and second members of an apparatus together to minimize the occurences of structural failures in said first and second members comprising the steps of:

determining the highest probable structural failure initiation locations of at least said first member,
   preparing a mask of preselected insulating material having at least one aperture therein, said at least one aperture positioned, sized and shaped to define at least one common bonding area between said first and second members, with said at least one aperture being located in an area removed from said highest probably structural failure initiation locations, whereby structural failures induced by the bonding and loading characteristics of the first and second members are minimized;

placing a layer of bonding material on a surface of said second member;

placing said mask over said layer of bonding material;

placing said first member over and directly against said mask;

bonding said first member to second member at said at least one bonding area.

2. The method of bonding, according to claim 1, wherein said step of bonding said first member to said second member, includes the step of:

heating said apparatus to aid in the bonding of said first member to said second member at said at least one common bonding area.

3. The method of bonding, according to claim 1, wherein said step is bonding said first member to said second member, includes the step of:

compressing said first and second members together to aid in the bonding of said first member to said second member at said at least one common bonding area.

4. The method of bonding, according to claim 2, wherein said step of bonding said first member to said second member includes the step of:

compressing said first and second members together to further aid in the bonding of said first member to said second member at said at least one common bonding area.

5. The method, according to claim 1, wherein the step of preparing a mask includes the step of:

locating said at least one aperture in an area where a conductive path between said first and second members is desired;

said bonding material being of a conductive material.

6. The method, according to claim 1, wherein the step of preparing a mask includes the step of:

locating said at least one aperture in an area such that the center of said at least one aperture is approximately aligned with the center of a component mounted on said first member.

7. A method of bonding first and second members of an apparatus together with a layer of bonding material to minimize structural failures in the members, comprising the steps of:

preparing a first mask of preselected insulating material having at least one aperture therein, said at least one aperture of said first mask positioned, sized and shaped to define at least one bonding area between said first member and said layer of bonding material;

preparing a second mask of preselected insulating material having at least one aperture therein, said at least one aperture of said second mask positioned, sized and shaped to define at least one bonding area between said second member and said layer of bonding material;

placing said first mask over and directly against said first member;

placing said layer of bonding material over said first mask;

placing said second mask over said layer of bonding material;

placing said second member over and directly against said second mask; and bonding said first member and said second member to said layer of bonding material at the respective bonding areas defined by said at least one aperture of said first mask and said at least one aperture of said second mask.

* * * * *